(12) United States Patent
Kiryu et al.

(10) Patent No.: US 7,484,153 B2
(45) Date of Patent: Jan. 27, 2009

(54) SYSTEMS AND METHODS FOR LBIST TESTING USING ISOLATABLE SCAN CHAINS

(75) Inventors: Naoki Kiryu, Tokyo (JP); Mack Wayne Riley, Austin, TX (US); Nathan Paul Chelstrom, Austin, TX (US)

(73) Assignees: Kabushiki Kaisha Toshiba, Tokyo (JP); International Business Machines Corporation, Armonk, NY (US)

( * ) Notice: Subject to any disclaimer, the term of this patent is extended or adjusted under 35 U.S.C. 154(b) by 96 days.

(21) Appl. No.: 11/295,057

(22) Filed: Dec. 6, 2005

(65) Prior Publication Data

US 2007/0130489 A1 Jun. 7, 2007

(51) Int. Cl.
*G01R 31/28* (2006.01)

(52) U.S. Cl. .................................. 714/733; 714/727
(58) Field of Classification Search .................. None
See application file for complete search history.

(56) References Cited

U.S. PATENT DOCUMENTS

| | | | | |
|---|---|---|---|---|
| 5,150,366 A | * | 9/1992 | Bardell et al. | 714/728 |
| 5,487,074 A | * | 1/1996 | Sullivan | 714/727 |
| 5,974,578 A | * | 10/1999 | Mizokawa et al. | 714/727 |
| 6,550,020 B1 | | 4/2003 | Floyd et al. | |
| 7,146,548 B1 | * | 12/2006 | Abramovici | 714/724 |
| 2002/0184582 A1 | * | 12/2002 | Pouya et al. | 714/726 |
| 2003/0163773 A1 | * | 8/2003 | O'Brien et al. | 714/726 |
| 2004/0006729 A1 | * | 1/2004 | Pendurkar | 714/733 |
| 2004/0054950 A1 | * | 3/2004 | Larson et al. | 714/727 |
| 2004/0128596 A1 | * | 7/2004 | Menon et al. | 714/724 |
| 2004/0230882 A1 | * | 11/2004 | Huott et al. | 714/733 |
| 2005/0015693 A1 | * | 1/2005 | Anzou et al. | 714/744 |
| 2005/0097418 A1 | * | 5/2005 | Anzou et al. | 714/733 |
| 2005/0188290 A1 | * | 8/2005 | Motika et al. | 714/733 |

\* cited by examiner

*Primary Examiner*—John P Trimmings
*Assistant Examiner*—Steven D Radosevich
(74) *Attorney, Agent, or Firm*—Law Offices of Mark L. Berrier

(57) ABSTRACT

Systems and methods for performing logic built-in self-tests (LBISTs) in digital circuits, where boundary scan chains in functional blocks of the circuits can be selectively coupled/decoupled to isolate the functional blocks during LBIST testing. In one embodiment, processor cores of a multiprocessor chip are isolated and LBIST testing is performed to determine whether any of the processor cores is malfunctioning. If none of the processor cores malfunctions, the processor cores are tested in conjunction with the supporting functional blocks of the device to determine whether the multiprocessor is fully functional. If one or more processor cores malfunctions, these processor cores are isolated and the remaining processor cores are tested in conjunction with the supporting functional blocks of the device to determine whether the multiprocessor operates properly with reduced functionality.

8 Claims, 7 Drawing Sheets

SYSTEMS AND METHODS FOR LBIST TESTING USING ISOLATABLE SCAN CHAINS

BACKGROUND

1. Field of the Invention

The invention relates generally to the testing of electronic circuits, and more particularly to systems and methods for performing logic built-in self-tests (LBISTs) using circuitry that enables the isolation of scan chains in selected portions of the functional logic of a device under test.

2. Related Art

Digital devices are becoming increasingly complex. As the complexity of these devices increases, there are more and more chances for defects that may impair or impede proper operation of the devices. The testing of these devices is therefore becoming increasingly important.

Testing of a device may be important at various stages, including in the design of the device, in the manufacturing of the device, and in the operation of the device. Testing at the design stage ensures that the design is conceptually sound. Testing during the manufacturing stage may be performed to ensure that the timing, proper operation and performance of the device are as expected. Finally, after the device is manufactured, it may be necessary to test the device to determine whether it contains any defects that prevent it from operating properly during normal usage.

Ideally, it would be possible and/or practical to test the device for every possible defect. Because of the complexity of most devices, however, it would be prohibitively expensive to take the deterministic approach of testing every possible combination of inputs to each logic gate and states of the device. A more practical approach applies pseudorandom input test patterns to the inputs of the different logic gates. The outputs of the logic gates are then compared to the outputs generated by a "good" device (one that is known to operate properly) in response to the same pseudorandom input test patterns. The more input patterns that are tested, the higher the probability that the logic circuit being tested operates properly (assuming there are no differences between the results generated by the two devices.)

This non-deterministic approach can be implemented using logic built-in self-test (LBIST) techniques. For example, one LBIST technique (which uses what is referred to as a STUMPS architecture) involves incorporating latches between portions of the logic being tested (the target logic,) loading these latches with pseudorandom bit patterns and then capturing the bit patterns that result from the propagation of the pseudorandom data through the target logic. Conventionally, the captured bit patterns are scanned out of the scan chains into a multiple-input signature register (MISR,) in which the bit patterns are combined with an existing signature value to produce a new signature value. This signature value can be examined (e.g., compared with the signature generated in a device that is known to operate properly) to determine whether or not the device under test functioned properly during the test.

While this testing approach can be very effective, it does have some drawbacks. In some devices, such as multiprocessor integrated circuits, the device may be considered to be "good," even if some portions of the device include defects. For instance, in a multiprocessor having N processors, the multiprocessor may still be functional if one or more of the processors is defective. Using conventional LBIST testing techniques, however, there is only a single MISR value that indicates whether the device under test produced any errors or not. Any errors that are produced during testing are combined with other data, and possibly other errors, in the MISR, so it cannot be determined whether the errors arose in a single functional block (e.g. processor) or multiple blocks, or which if the functional blocks caused the error(s).

It would therefore be desirable to provide systems and methods for implementing LBIST testing that enable the isolation of selected portions of the target logic so that errors in the isolated portions do not corrupt the MISR signature during subsequent testing.

SUMMARY OF THE INVENTION

One or more of the problems outlined above may be solved by the various embodiments of the invention. Broadly speaking, the invention comprises systems and methods for performing logic built-in self-tests (LBISTs) in digital circuits. In one embodiment, a STUMPS-type LBIST architecture is implemented in a device under test. The LBIST circuitry includes a set of scan chains that are interposed with the target logic of the device under test. The scan chains are configured so that the last scan chain of one portion is coupled to the first scan chain of a succeeding portion. These scan chains are referred to herein as boundary scan chains. If none of the portions of the target logic are isolated, the scan chains function as if all of the scan chains were interposed with a single portion of target logic. If one of the portions of the target logic is isolated, the scan chains associated with the isolated portion are functionally disconnected from the scan chains in the preceding and succeeding portions of the target logic so that any errors generated in the isolated portion do not corrupt the data in the other scan chains or the resulting MISR signature.

One embodiment comprises a method for testing a multiprocessor device, including LBIST circuitry corresponding to one or more processor cores within the multiprocessor and performing LBIST testing on the isolated processor cores to determine whether the isolated processor cores operate properly. In one embodiment, the testing of the isolated processor cores is performed initially to determine whether any of the processor cores is malfunctioning. Any malfunctioning processor cores are then isolated and the remaining processor cores are tested in conjunction with the supporting functional blocks of the device. In one embodiment, full LBIST testing is performed on the entire multiprocessor and, if errors are detected, the processor cores are isolated and tested to determine whether any of them are separately malfunctioning.

An alternative embodiment comprises a method for isolating LBIST circuitry in a device. In this embodiment, each of a plurality of functional blocks in the device has a corresponding set of scan chains interposed therewith and each functional block one or more boundary scan chains that are selectively coupled to the boundary scan chains of other functional blocks. Then, the boundary scan chains of each functional block are selectively coupled with or decoupled from the boundary scan chains of other functional blocks. In one embodiment, the coupling/decoupling of the boundary scan chains is performed by connecting the boundary scan chains through AND gates. The boundary scan chains are then coupled/decoupled by asserting/deasserting a control input to the AND gates. This can be done, for instance, by loading an appropriate value into a latch in a control scan chain.

Another alternative embodiment comprises a device having functional logic, including multiple functional blocks, and LBIST circuitry, including a plurality of scan chains interposed with the functional logic. In this embodiment, each functional block has a corresponding group of the scan chains interposed within it, and the group of scan chains in each functional block includes boundary scan chains that can be alternately coupled to or decoupled from the boundary scan chains of other functional blocks. In one embodiment, the LBIST circuitry comprises a plurality of STUMPS-type LBIST satellites corresponding to the functional blocks. A common LBIST controller provides control signals to each of the LBIST satellites to control their operation. In one embodiment, AND gates are coupled between the boundary scan chains of pairs of functional blocks. The AND gates have inputs to receive control signals that cause the AND gates to pass either a value from a preceding boundary scan chain (if coupled) or a 0 (if decoupled) to a subsequent boundary scan chain. The control signal may be provided from a latch in a control scan chain Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
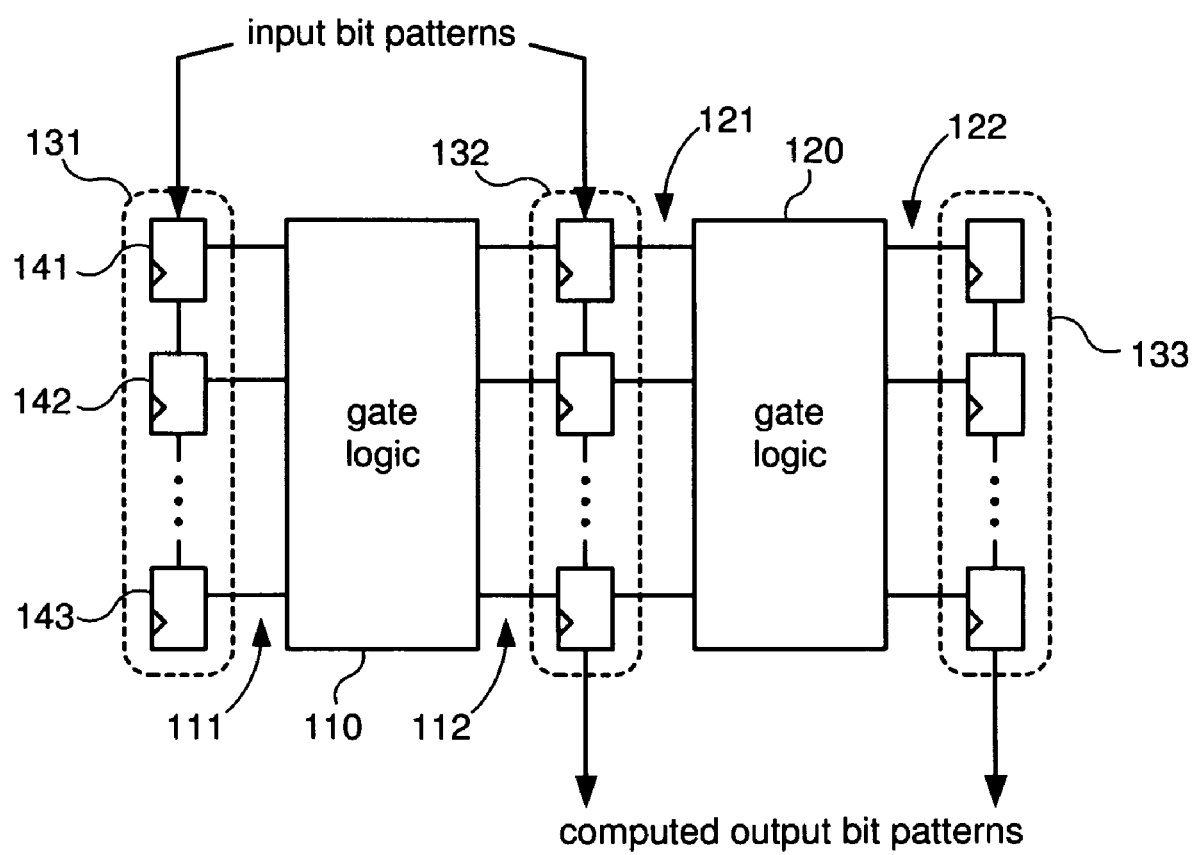
FIG. 1 is a functional block diagram illustrating the principal of operation of a simple STUMPS-type LBIST system.

While the invention is subject to various modifications and alternative forms, specific embodiments thereof are shown by way of example in the drawings and the accompanying detailed description. It should be understood, however, that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for performing logic built-in self-tests (LBISTs) in digital circuits, where individual functional blocks (e.g., processor cores) can be isolated to localize errors generated during testing and prevent the errors from corrupting test data generated in other functional blocks.

In one embodiment, a STUMPS-type LBIST architecture is implemented in a device under test. The LBIST circuitry includes a set of scan chains that are interposed with the target logic of the device under test. The scan chains are configured so that the last scan chain of one portion is coupled to the first scan chain of a succeeding portion. These first/last scan chains are referred to herein as boundary scan chains. If none of the portions of the target logic are isolated, the scan chains function as if all of the scan chains were interposed with a single portion of target logic. If one of the portions of the target logic is isolated, the scan chains associated with the isolated portion are functionally disconnected from the scan chains in the preceding and succeeding portions of the target logic so that any errors generated in the isolated portion do not corrupt the data in the other scan chains or the resulting MISR signature.

In one embodiment, the latches of a first boundary scan chain (the last in the corresponding functional block) are coupled to the latches of a second boundary scan chain (the first in the corresponding functional block) through AND gates. That is, the output of a latch in the first boundary scan chain is provided as an input to an AND gate. The output of the AND gate is provided as an input to a corresponding latch of the second boundary scan chain. Each AND gate also has a second input that receives a control signal. If the control signal is a 1, the value in the latch of the first boundary scan chain is passed through to the latch of the second boundary scan chain. If the control signal is a 0, the AND gate passes a 0 to the latch of the second boundary scan chain. In one embodiment, the control signal is provided by a latch of a control scan chain to all of the AND gates between a pair of boundary scan chains.

The various embodiments of the invention may provide a number of advantages over conventional systems. For example, in conventional systems, the scan chains that are interposed with different functional blocks cannot be isolated, so the errors generated in one functional block cannot be localized. It may therefore be difficult or even impossible to determine the source of the error. Further, because the functional blocks cannot be isolated, even if the source of the error can be determined, it may be impossible to prevent the error from propagating from this functional block to another one. Consequently, it may not be possible to determine whether the other functional blocks are operating properly. Embodiments of the present invention enable the selective isolation of particular functional blocks so that they do not corrupt test data for the remainder of the functional logic. It is therefore possible to determine whether a device can function properly with reduced capabilities (e.g., with only n−1 of n processor cores functioning properly.)

Various embodiments of the invention will be described below. Primarily, these embodiments will focus on implementations of an LBIST architecture within an integrated circuit. It should be noted that these embodiments are intended to be illustrative rather than limiting, and alternative embodiments may be implemented in BIST architectures other than the specific architecture described in detail below, and may also be implemented in circuits whose components are not strictly limited to logic components (e.g., AND gates, OR gates, and the like). Many such variations will be apparent to persons of ordinary skill in the art of the invention and are intended to be encompassed by the appended claims.

Referring to FIG. 1, a functional block diagram illustrating the principal of operation of a simple STUMPS-type LBIST system is shown. The LBIST system is incorporated into an integrated circuit. In this figure, the functional logic of the integrated circuit includes a first portion 110 and a second portion 120.

Functional logic 110 is, itself, a logic circuit having a plurality of inputs 111 and a plurality of outputs 112. Similarly, functional logic 120 forms a logic circuit having a plurality of inputs 121 and a plurality and outputs 122. Functional logic 110 is coupled to functional logic 120 so that, in normal operation, outputs 112 of functional logic 110 serve as inputs 121 to functional logic 120.

Each of the inputs to, and outputs from, functional logic 110 and 120 is coupled to a scan latch. The set of scan latches 131 that are coupled to inputs 111 of functional logic 110 forms one is referred to as a scan chain. The latches are serially coupled together so that bits of data can be shifted through the latches of a scan chain. For example, a bit may be scanned into latch 141, then shifted into latch 142, and so on, until it reaches latch 143. More specifically, as this bit is shifted from latch 141 into latch 142, a second bit is shifted into latch 141. As a bit is shifted out of each latch, another bit is shifted into the latch. In this manner, a series of data bits can be shifted, or scanned, into the set of latches in scan chain 131, so that each latch stores a corresponding bit. Data can likewise be scanned into the latches of scan chain 132.

Just as data can be scanned into the latches of a scan chain (e.g., 131,) data can be scanned out of the latches of a scan chain. As depicted in FIG. 1, the latches of scan chain 132 are coupled to the outputs of functional logic 110. Each of these latches can store a corresponding bit than his output by functional logic 110. After these output bits are stored in the latches of scan chain 132, the output data bits can be shifted through the series of latches and provided as an output bit stream. Data can likewise be scanned out of the latches of scan chain 133. It should be noted that the structure illustrated in FIG. 1 does not show data being scanned into scan chain 133, or data being scanned out of scan chain 131. Alternative embodiments may be configured to scan data in and out of these scan chains.

The LBIST system of FIG. 1 operates basically as follows. Pseudorandom bit patterns are generated and are scanned into the scan chains (131, 132) that are coupled to the inputs of functional logic 110 and 120. The pseudorandom bit patterns that are stored in scan chains 131 and 132 are then propagated through the corresponding functional logic. That is, the bit pattern in scan chain 131 is propagated through functional logic 110, while the bit pattern in scan chain 132 is propagated through functional logic 120. Functional logic 110 and 120 process the inputs and generate a corresponding set of outputs. These outputs are captured (stored) in the scan chains (132 and 133) that are coupled to the outputs of the functional logic. The output bit patterns stored in scan chains 132 and 133 are then scanned out of these scan chains.

Figure 2:
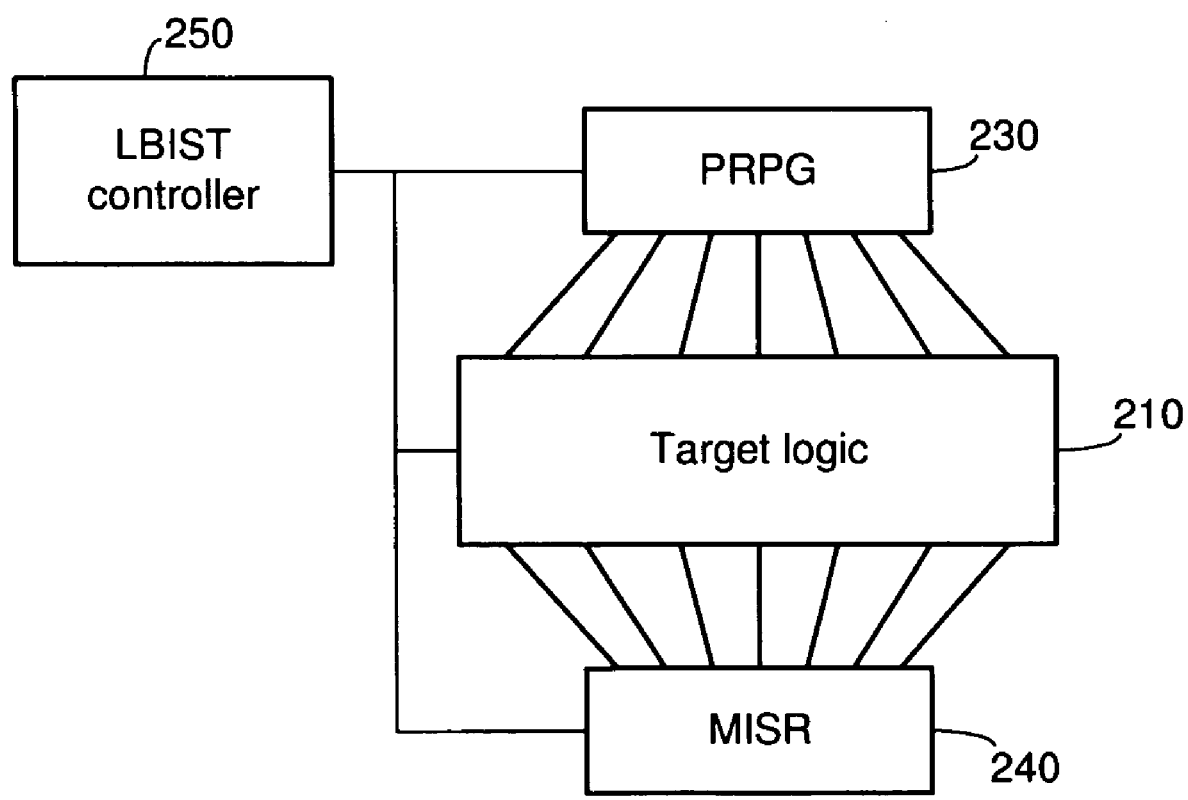
FIG. 2 is a functional block diagram illustrating the structure of a conventional LBIST system having a STUMPS architecture.

Referring to FIG. 2, a functional block diagram illustrating the structure of a conventional LBIST system having a STUMPS architecture is shown. The LBIST system is implemented in a device that includes target logic 210. Multiple scan chains (not explicitly shown in the figure) are interposed with the components of target logic 210. That is, the scan chains are positioned between portions of the target logic, so that each portion of the target logic receives its inputs from a first one of the scan chains and provides its outputs to a succeeding one of the scan chains as illustrated in FIG. 1.

Each of the scan chains is coupled to pseudorandom pattern generator (PRPG) 230 and is configured to receive pseudorandom bit patterns that are generated by PRPG 230. As these bit patterns are scanned into the scan chains from PRPG 230, the bits that were previously stored in the scan chains are scanned out and provided to multiple input signature register (MISR) 240. The operation of PRPG 230, the scan chains and MISR 240 are controlled by signals received from LBIST controller 250.

During an initialization phase, LBIST controller 250 prepares the components of the system for LBIST operation. For example, it may reset various components (e.g., MISR 240,) provide a seed for PRPG 230, set values in registers, and so on. If the test cycles begin with a functional phase, LBIST controller 250 may need to scan a first set of pseudorandom bit patterns into the scan chains. Subsequently, in a functional phase, LBIST controller 250 controls the propagation of the pseudorandom bit patterns through the target logic. Then, in a scan shift phase, LBIST controller 250 controls the LBIST components to scan bit patterns out of the scan chains (at the same time new bit patterns are scanned into the scan chains) an into MISR 240. LBIST controller 250 repeats this to cause execution of some number of test cycles. The resulting signature value in MISR 240 can then be compared with a corresponding signature in a good device to determine whether the device under test functioned properly during the LBIST testing.

It should be noted that, although the target logic of the device under test often includes multiple functional blocks, the test data from all of these functional blocks is typically combined by a MISR into a single signature value. As a result, errors in one functional block cause the entire signature value to be corrupted. The test result is therefore a simple pass/fail result, rather than a result that distinguishes between a reduced, but still acceptable level of functionality and complete failure.

Figure 3:
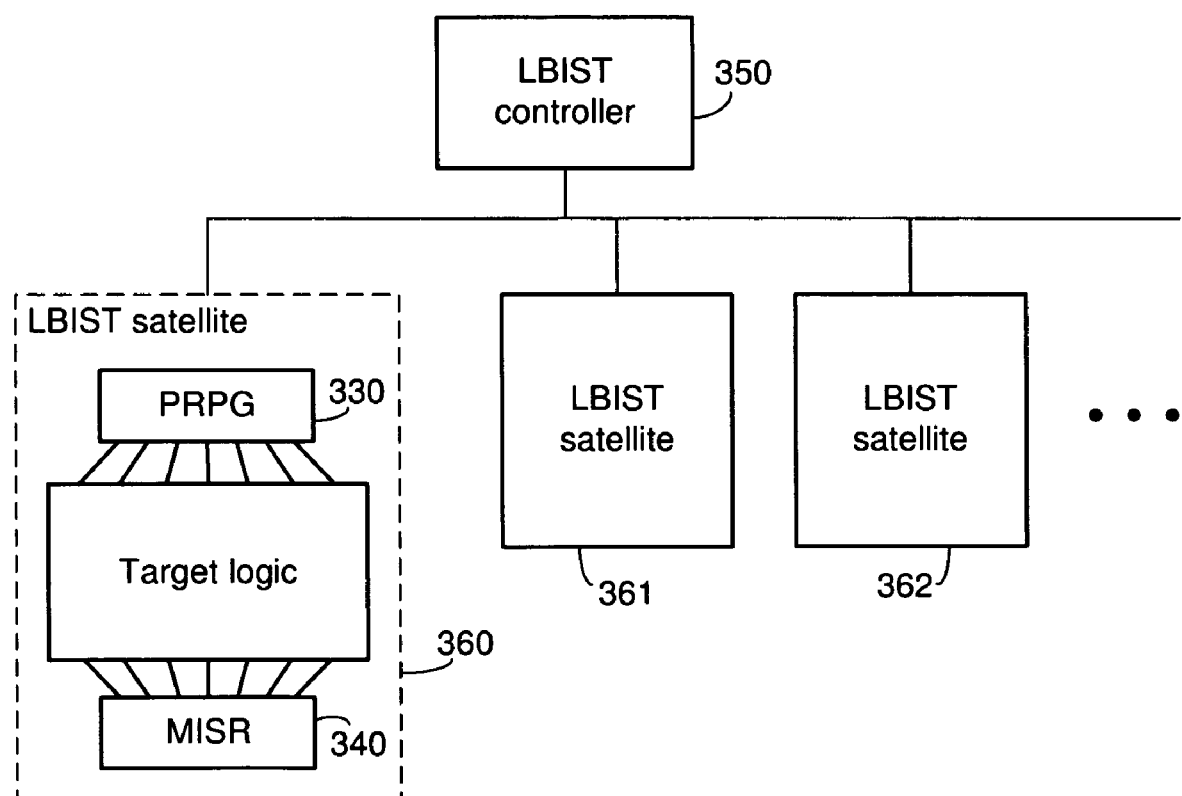
FIG. 3 is a functional block diagram illustrating an LBIST satellite architecture in accordance with one embodiment.

Referring to FIG. 3, a functional block diagram illustrating an LBIST satellite architecture in accordance with one embodiment is shown. In this figure, there is a single LBIST controller 350 that is coupled to multiple LBIST satellites 360-362. While the figure explicitly depicts three LBIST satellites, alternative embodiments may have as few as two satellites, or they may have many more satellites. Each of the LBIST satellites shown in FIG. 3 has a PRPG (e.g., 330,) a MISR (e.g., 340,) and a set of scan chains in the target logic (e.g., 320.)

In this system, LBIST controller 350 controls each of LBIST satellites 360-362 in essentially the same manner. For instance, LBIST controller 350 prepares the components of each satellite for LBIST operation during the initialization phase. During each test phase, LBIST controller 350 provides timing signals to each of the satellites to cause them to perform one or more test cycles. During the scan shift phase of each test cycle, LBIST controller 350 provides signals to cause each of the LBIST satellites to scan bit patterns into and out of their respective scan chains. During the functional phase of each test cycle, LBIST controller 350 provides signals to cause each of the LBIST satellites to propagate the pseudorandom bit scan bit patterns scanned into their scan chains through the corresponding portions of the target logic and capture the resulting bit patterns in the scan chains. During a termination phase, LBIST controller 350 may cause the MISR signature values generated in each of the LBIST satellites to be read out for comparison to values generated by a control device.

It should be noted that, while the embodiments described herein have a simple STUMPS-type structure having a PRPG, a set of scan chains and a MISR, other embodiments may be more complex. For example, they may include phase shift and spread blocks to improve the randomness of the patterns generated by the PRPG, or programmable channel weight and selector blocks to alter the proportions of 0's and 1's in the bit patterns. Similarly, space compactor blocks may be used to compact the resulting bit patterns before they are provided to the MISR to generate a signature value. Still other components could be added as well.

Figure 4:
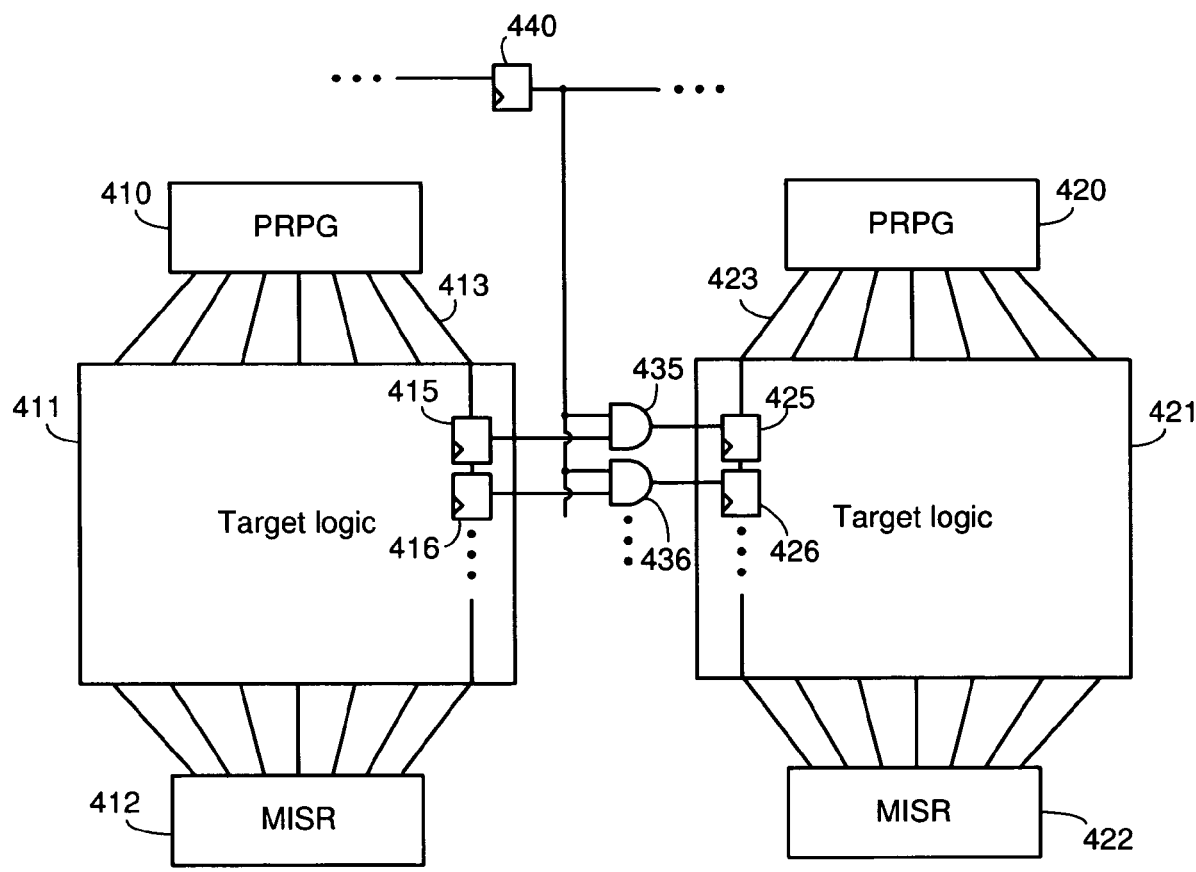
FIG. 4 is a diagram illustrating the interconnection of scan chains between two LBIST satellites in accordance with one embodiment.

Referring to FIG. 4, a diagram illustrating the interconnection of scan chains between two LBIST satellites in accordance with one embodiment is shown. As depicted in the figure, each satellite includes a PRPG (410, 420,) target logic (411, 421) and a MISR (412, 422.) For purposes of clarity, each scan chain (except for one in each satellite, as will be explained in more detail below) is represented by a line originating at the PRPG of the satellite, passing through the corresponding target logic, and terminating at the satellite's MISR.

It can be seen in from FIG. 4 that the scan chains of the two LBIST satellites are coupled together. More specifically, the latches of the last scan chain (413) in one of the satellites are coupled to corresponding latches in the first scan chain (423) of the other satellite. Because the latches in these scan chains are at the boundaries of the respective satellites, they are referred to herein as boundary latches. With the coupling of the boundary latches, the LBIST satellites are serially coupled together, each of the satellites being coupled to the adjacent satellites in the manner illustrated in FIG. 4. The first and last satellites, of course, are coupled only to the following and preceding satellites, respectively.

The boundary latches of the two LBIST satellites are coupled together in a selective manner. That is, the latches of one scan chain can be alternately coupled to or decoupled from the latches of the other scan chain. This is accomplished by providing the output of the boundary latches (e.g., 415, 416) in scan chain 413 as inputs to corresponding AND gates (e.g., 435, 436,) and providing the outputs of the AND gates as inputs to the boundary latches (e.g., 425, 426) in scan chain 423. Each of the AND gates also receives a control signal as an input. The same signal is provided to all of the AND gates between a particular pair of satellites. When the control signal is high, the values in the boundary latches (e.g., 415, 416) of scan chain 413 are passed through to the boundary latches (e.g., 425, 426) of scan chain 423. When the control signal is low, the outputs of all of the AND gates (e.g., 435, 436) are low, so 0's are passed to all of the boundary latches (e.g., 425, 426) of scan chain 423. In the embodiment of FIG. 4, the control signal is provided by a control latch 440. Control latch 440 is part of a control scan chain that is used to load control data into various parts of the LBIST circuitry, or to read data out of the LBIST circuitry. This control scan chain will be described in more detail in connection with FIG. 5.

Figure 5:
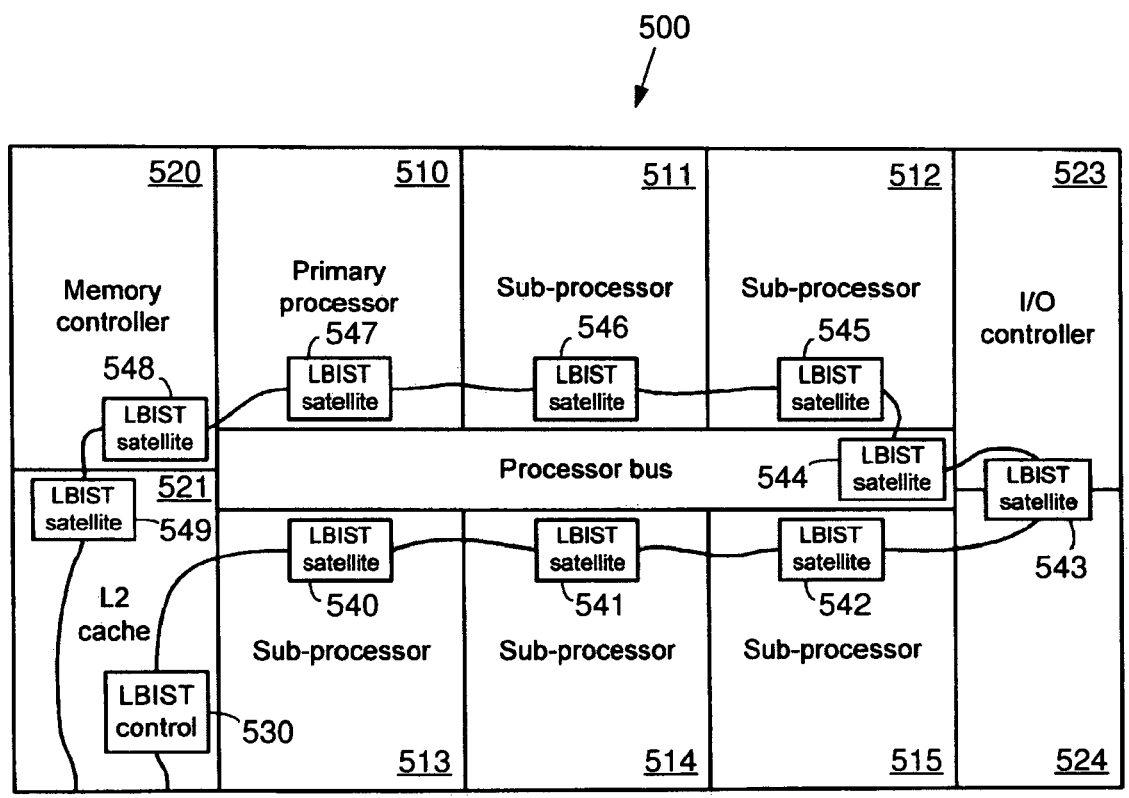
FIG. 5 is a diagram illustrating the positioning of an LBIST controller and LBIST satellites in accordance with one embodiment.

Referring to FIG. 5, a diagram illustrating the positioning of an LBIST controller and LBIST satellites in accordance with one embodiment is shown. Depicted in this figure is a multiprocessor integrated circuit 500. Integrated circuit 500 includes multiple functional blocks that form the components of the multiprocessor. These functional blocks include a primary processor 510, a set of sub-processor cores (SPCs) 511-515, and a set of components 520-524 that provide support functions. Support components 520-524 may include such things as internal busses, input/output interfaces, cache memories, and the like.

It can be seen in FIG. 5 that the multiprocessor chip includes an LBIST controller 530 and multiple LBIST satellites 540-549. Each of the LBIST satellites is co-located with a corresponding one of the functional blocks of the multiprocessor chip. For example, LBIST satellite 540 is co-located with functional block 513, and satellite 541 is co-located with functional block 514. This is because the various functional blocks of the multiprocessor (510-515 and 520-524) are the target logic that is tested by each of the LBIST satellites. It can be seen that some of the LBIST satellites are co-located with more than one functional block. For instance, LBIST satellite 543 is shown in a position that overlaps with functional blocks 523 and 524. In this case, functional blocks 523 and 524 together form the target logic that is tested by LBIST satellite 543.

LBIST controller 530 is not associated with only one of the functional blocks and obviously cannot be co-located with every one of the functional blocks. In this embodiment, LBIST controller 530 is positioned in functional block 521, but this may vary in other embodiments.

It should be noted that "co-located," as used here, refers to the fact that the components of a particular LBIST satellite are positioned within or near the corresponding functional block. Because the latches of the satellite's scan chains are necessary positioned between the logic gates of the functional block, they are "within" the functional block. The PRPG, MISR and other LBIST satellite components may be positioned within the functional block or outside, but near, the boundaries of the functional block, depending upon the specific layout of the device.

LBIST controller 530 is coupled to each of LBIST satellites 540-549 through control lines. As described above, LBIST controller 530 uses the control lines to provide control signals to LBIST satellites 540-549 and thereby cause the satellites to perform LBIST test cycles. The control lines are not explicitly shown in FIG. 5 for purposes of clarity.

The LBIST system depicted in FIG. 5 includes a control scan chain 550. Control scan chain 550 is used to load and unload data from LBIST controller 530 and LBIST satellites 540-549. In this embodiment, control scan chain 550 comprises scan chain segments that extend from an external input port to LBIST controller 530, from LBIST controller 530 to LBIST satellite 540, and so on. The last segment of control scan chain 550 extends from LBIST satellite 549 to an external output port. Segments of control scan chain 550 may also couple various components within LBIST controller 530 and/or LBIST satellites 540-549. For example, a segment may couple the PRPG of a satellite to the MISR of the satellite, so that the data path of control scan chain 550 enters the satellite, passes through the PRPG, then passes through the MISR and exits the satellite. Other embodiments may, of course, be configured in a different manner.

The selective coupling or decoupling of the boundary latches in successive LBIST satellites can be used to isolate the satellites from each other and thereby prevent errors that arise in one of the satellites from corrupting test data that is generated in other satellites. This can be useful in localizing errors that occur during LBIST testing to within a particular functional block. In the multiprocessor chip of FIG. 5, the isolation of LBIST satellites can enable the isolation of errors within certain processor cores on the chip. Since a multiprocessor chip may still be useful even when one of the processor cores malfunctions (albeit at a lower level of performance,) isolation and identification of a malfunctioning processor core allows the multiprocessor chip to be used for lower-performance applications (e.g., the chip can be sold as a lower-performance multiprocessor instead of being scrapped.)

Figure 6:
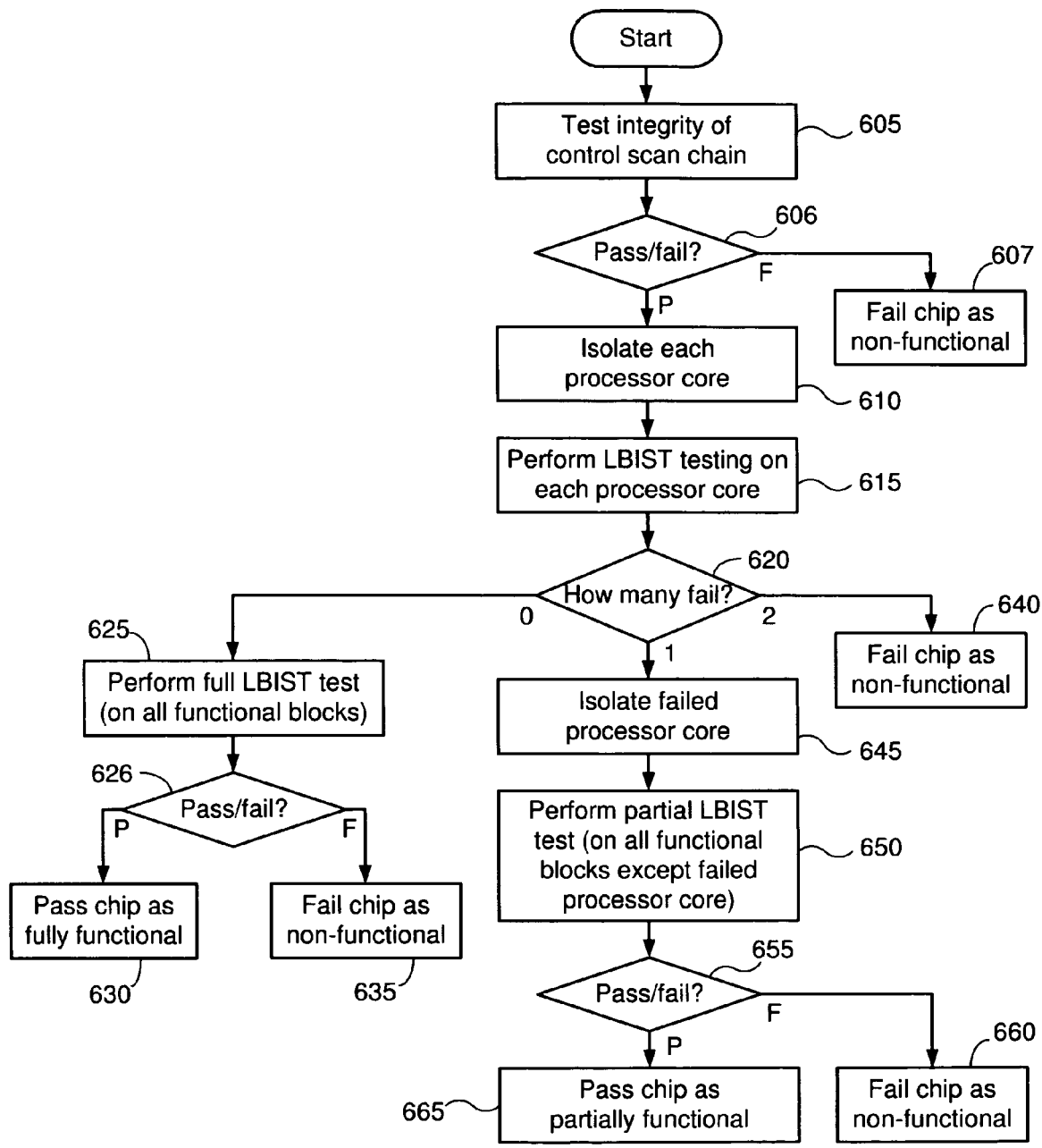
FIG. 6 is a flow diagram illustrating the LBIST testing of a multiprocessor core in accordance with one embodiment.

Referring to FIG. 6, a flow diagram illustrating the LBIST testing of a multiprocessor core in accordance with one embodiment is shown. FIG. 6 depicts a method by which a multiprocessor chip incorporating isolation mechanisms as described above is tested to determine whether it is fully functional, partially functional, or non-functional. In this instance, "fully functional" means that all of the processor cores, as well as all of these supporting functional blocks within chip are operating properly. "Partially functional" means that one of the processor cores is malfunctioning, but all of the other processor cores into the supporting functional blocks are operating properly. "Non-functional" means that two or more of the processor cores are malfunctioning. It should be noted that, in other instances, the multiprocessor may be defined as partially functional when different numbers of processors (e.g., two or three) have failed.

The multiprocessor chip being tested is assumed to have a control scan chain as described in connection with FIG. 5. As depicted in FIG. 6, the method begins with the testing of the control scan chain (block 605) to ensure that control data can be properly shifted through the LBIST components. If, at block 606, the control scan chain is not operating properly, the chip is failed (block 607.) If the control scan chain operates properly, then LBIST testing continues. After the control scan chain is tested, the individual processor cores are isolated (block 610) using the mechanism described above. After the processor cores have been isolated, each core is tested to determine whether it functions properly (block 615.) If all of the processor cores operate properly (block 620,) a full test of the multiprocessor chip, including the processor cores and the supporting functional blocks, is performed (block 625.) If the multiprocessor chip passes this test, it is fully functional (block 630.) If, the other hand, the multiprocessor chip fails this test, the failure is necessarily a result of one or more malfunctions in the supporting functional blocks (rather than the processor cores, which were previously found to operate properly,) so the chip as a unit is considered non-functional (block 635.)

If, at block 620, it is determined that two or more of the processor cores failed individual testing, then the chip as a unit is failed (block 640.) If, at block 620, only one processor core is found to have failed, then the multiprocessor chip may still be usable with reduced functionality. The method therefore continues with the isolation of the failed processor core (block 645) and partial testing of the remaining components (block 650,) including the non-failed processor cores and the supporting functional blocks. If, at block 655, the multiprocessor chip fails partial testing with the malfunctioning processor core isolated, then the supporting functional blocks have now functioned as well, and the microprocessor chip is failed as a unit (block 660.) If, on the other hand, the multiprocessor with the isolated core passes partial testing, then the chip is passed as a reduced-functionality unit (block 665.)

Figure 7:
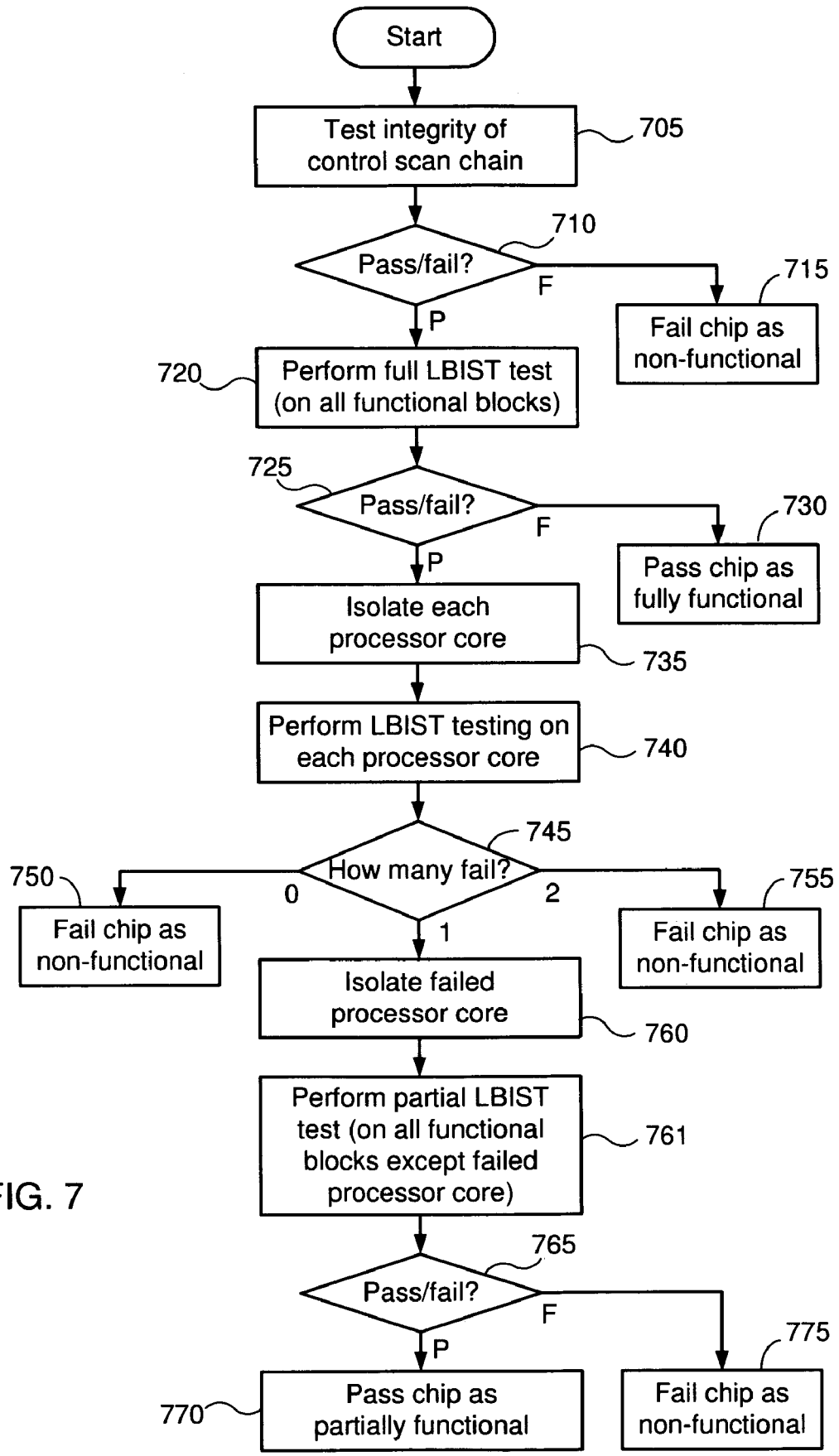
FIG. 7 is a flow diagram illustrating an alternative method for testing a multiprocessor chip in accordance with one embodiment.

Referring to FIG. 7, a flow diagram illustrating an alternative method for testing a multiprocessor chip in accordance with one embodiment is shown. It is again assumed that the multiprocessor chip includes a control scan chain that is used to load data into and unload data from various LBIST components. Accordingly, the method begins with the testing of the control scan chain (block 705) to ensure that data can be properly loaded into and unloaded from the LBIST components. If, at block 710, it is determined that the control scan chain is not operating properly, the chip fails and testing is discontinued (block 715.) If the control scan chain is operating properly, testing continues at block 720.

In this embodiment, after the control scan chain is tested, LBIST testing is performed on the entire chip (block 720,) including the processor cores and the supporting functional blocks. If the microprocessor chip passes this testing (block 725, all of the functional blocks, including processor cores, are operating properly, so the chip is passed (block 730,) and the chip is fully functional and has the highest possible performance (that is, all of the processor cores are functional.) If testing of the entire chip results in a failure, the individual processor cores are isolated (block 735) and LBIST testing is performed on the isolated processor cores (block 740.)

If, at block 745, none of the isolated processor cores fail this testing, the malfunction detected earlier (at block 725) must have arisen in the supporting functional blocks, rather than one of the processor cores, so the chip is failed as a unit (block 750.) If, at block 745, two or more of the processor cores fail LBIST testing, the chip is again failed as a unit (block 755.) (As noted above, non-functionality is defined in this scenario as two or more of the processor cores malfunctioning.) If, however, only a single one of the processor cores fails, this processor core is isolated, and LBIST testing is performed on the entire microprocessor chip, except for the fail to processor core (block 760.) If, at block 765, the microprocessor chip passes this testing, the chip is passed as a lower-performance unit (block 770.) That is, the unit as a whole is functional, but not all of the processor cores are functional. If, at block 765 the microprocessor chip fails the LBIST testing, there is a malfunction in one or more of the supporting functional blocks, and the unit is considered to have failed testing (block 775.)

While the foregoing description presents several specific exemplary embodiments, there may be many variations of the described features and components in alternative embodiments. For example, the methods described in connection with the flow diagrams of FIGS. 6 and 7 are merely examples of the different methods that are possible for LBIST testing using selective isolation f functional blocks in a logic circuit. Alternative methods may perform similar steps in a different order, or may use different approaches that include isolation of particular blocks of logic and testing of the isolated block or the logic that is not isolated. Further, other embodiments may include devices that incorporate alternative mechanisms for isolating the functional blocks within the devices so that these blocks, or logic excluding these blocks can be tested.

Those of skill in the art will understand that information and signals may be represented using any of a variety of different technologies and techniques. For example, data, instructions, commands, information, signals, bits, and symbols that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of storage medium known in the art. Such a storage medium containing program instructions that embody one of the present methods is itself an alternative embodiment of the invention. One exemplary storage medium may be coupled to a processor, such that the processor can read information from, and write information to, the storage medium. In the alternative, the storage medium may be integral to the processor. The processor and the storage medium may reside, for example, in an ASIC. The ASIC may reside in a user terminal. The processor and the storage medium may alternatively reside as discrete components in a user terminal or other device.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A method for isolating logic built-in self-test (LBIST) circuitry in a device comprising:
   providing a plurality of scan chains interposed with functional logic of the device, wherein each of a plurality of functional blocks in the device has a corresponding set of scan chains interposed therewith, and wherein the set of scan chains corresponding to each functional block includes one or more boundary scan chain that is selectively coupled to one or more boundary scan chains of other functional blocks; and
   selectively coupling or decoupling the boundary scan chains of each functional block with the boundary scan chains of other functional blocks;
   wherein the boundary scan chains in the processor cores and supporting functional blocks are selectively coupled to the boundary scan chains in other processor cores and supporting functional blocks through AND gates, wherein the coupling the boundary scan chains comprises asserting a control input to the AND gates, wherein the decoupling the boundary scan chains comprises deasserting the control input to the AND gates, and wherein the asserting or the deasserting the control input to each AND gate comprises loading a corresponding value in a control latch, wherein an output of the control latch is coupled to an input of the AND gate.

2. The method of claim 1, wherein the control latch comprises a latch in a control scan chain, and wherein loading the value in the control latch comprises scanning control data into the control scan chain.

3. A device comprising:
   functional logic, including multiple functional blocks; and
   logic built-in self-test (LBIST) circuitry including a plurality of scan chains interposed with the functional logic;
   wherein each functional block has a corresponding group of the scan chains interposed therewith; and
   wherein the group of scan chains in each functional block includes one or more boundary scan chain that is configured to be alternately coupled to or decoupled from one or more boundary scan chains of other functional blocks
   further comprising a plurality of AND gates coupled between the boundary scan chains of adjacent functional blocks, wherein each AND gate has a control input configured to receive a control signal, wherein when the control signal is asserted, a value is passed from a preceding boundary scan chain to a subsequent boundary scan chain, and wherein when the control signal is deasserted, a 0 is passed to the subsequent boundary scan chain;
   wherein the LBIST circuitry further comprises a control scan chain that includes a plurality of control input latches, wherein each of the control input latches provides a value stored therein to a corresponding set of AND gates coupled between a corresponding pair of boundary scan chains.

4. The device of claim 3, wherein the LBIST circuitry comprises a plurality of LBIST satellites, wherein each LBIST satellite corresponds to one of the functional blocks.

5. The device of claim 4, further comprising a common LBIST controller coupled to each of the LBIST satellites and configured to provide control signals to each of the LBIST satellites.

6. The device of claim 4, wherein each LBIST satellite has a STUMPS-type architecture and includes a test pattern generator, the group of scan chains corresponding to the functional block, and a multiple-input signature register (MISR).

7. The device of claim 4, wherein when the boundary scan chain of a preceding LBIST satellite is coupled to the boundary scan chain of a subsequent LBIST satellite, errors generated in the preceding LBIST satellite can be propagated to the subsequent LBIST satellite and when the boundary scan chain of the preceding LBIST satellite is decoupled from the boundary scan chain of the subsequent LBIST satellite, errors generated in the preceding LBIST satellite cannot be propagated to the subsequent LBIST satellite.

8. The device of claim 3, wherein the device comprises a multiprocessor chip and the functional blocks include a plurality of processor cores.

* * * * *